US 9,318,135 B2

(12) United States Patent
Nojima

(10) Patent No.: US 9,318,135 B2
(45) Date of Patent: Apr. 19, 2016

(54) METHOD OF MANUFACTURING PIEZOELECTRIC ELEMENT

(75) Inventor: Akira Nojima, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 1098 days.

(21) Appl. No.: 13/314,246

(22) Filed: Dec. 8, 2011

(65) Prior Publication Data

US 2012/0176703 A1 Jul. 12, 2012

(30) Foreign Application Priority Data

Jan. 7, 2011 (JP) ................................. 2011-002507
Nov. 30, 2011 (JP) ................................. 2011-262846

(51) Int. Cl.
| | | |
|---|---|---|
| *G11B 5/48* | (2006.01) | |
| *H01L 41/27* | (2013.01) | |
| *H01L 41/09* | (2006.01) | |
| *H01L 41/253* | (2013.01) | |
| *H01L 41/37* | (2013.01) | |
| *H01L 41/338* | (2013.01) | |
| *C08G 59/72* | (2006.01) | |
| *C08G 73/10* | (2006.01) | |
| *H01L 41/29* | (2013.01) | |

(52) U.S. Cl.
CPC .............. *G11B 5/483* (2015.09); *H01L 41/094* (2013.01); *H01L 41/253* (2013.01); *H01L 41/27* (2013.01); *H01L 41/338* (2013.01); *H01L 41/37* (2013.01); *C08G 59/72* (2013.01); *C08G 73/10* (2013.01); *C08G 73/1082* (2013.01); *H01L 41/29* (2013.01); *Y10T 29/42* (2015.01); *Y10T 29/49025* (2015.01)

(58) Field of Classification Search
CPC ..... H01L 41/094; H01L 41/253; H01L 41/27; H01L 41/338; H01L 41/37; H01L 41/29; Y10T 29/41; Y10T 29/49025; Y10T 29/42; G11B 5/482; C08G 59/72; C08G 73/10; C08G 73/1082

See application file for complete search history.

(56) References Cited

U.S. PATENT DOCUMENTS

| | | | | |
|---|---|---|---|---|
| 5,408,376 | A * | 4/1995 | Nishikura et al. | .... H01L 41/094 |
| 5,594,093 | A * | 1/1997 | Sotoyama et al. | . C08G 73/1082 |
| 5,615,466 | A * | 4/1997 | Safari et al. | ........... H01L 41/257 |
| 6,037,703 | A * | 3/2000 | Kambe et al. | ........... Y10T 29/42 |
| 7,082,655 | B2 * | 8/2006 | Yetter et al. | ............. H01L 41/37 |
| 2002/0014815 | A1 | 2/2002 | Kurano et al. | |
| 2002/0043894 | A1 | 4/2002 | Koganezawa et al. | |
| 2003/0227234 | A1 | 12/2003 | Namerikawa et al. | |
| 2004/0201925 | A1 | 10/2004 | Huha et al. | |

(Continued)

FOREIGN PATENT DOCUMENTS

| | | |
|---|---|---|
| CN | 101615650 | 12/2009 |
| JP | 58-190110 | 11/1983 |
| JP | 2002-141569 | 5/2002 |

(Continued)

*Primary Examiner* — A. Dexter Tugbang
(74) *Attorney, Agent, or Firm* — Jordan and Hamburg LLP

(57) ABSTRACT

An method of manufacturing a piezoelectric element easily and surely forms polymer coatings on peripheral end faces of the piezoelectric element without deteriorating a yield of the piezoelectric element. The method includes steps of cutting a piezoelectric element out from a base piezoelectric material plate so that peripheral end faces are formed to define a peripheral shape of the piezoelectric element, and forming polymer coatings on at least objective areas of the peripheral end faces of the piezoelectric element by vapor deposition polymerization, respectively.

12 Claims, 9 Drawing Sheets

(56) References Cited

U.S. PATENT DOCUMENTS

2008/0315190 A1   12/2008   Tsukagoshi et al.
2009/0316306 A1   12/2009   Yao et al.

FOREIGN PATENT DOCUMENTS

| | | |
|---|---|---|
| JP | 2002-184140 | 6/2002 |
| JP | 2002-373475 | 12/2002 |
| JP | 2003-61371 | 2/2003 |
| JP | 2003-266691 | 9/2003 |
| JP | 2004-64038 | 2/2004 |
| JP | 2004-310973 | 11/2004 |
| JP | 2005-228767 | 8/2005 |
| JP | 2008154190 A * | 7/2008 |
| JP | 2010-171165 | 8/2010 |
| WO | WO-2007/026608 | 3/2007 |
| WO | WO-2009/009943 | 8/2009 |

* cited by examiner

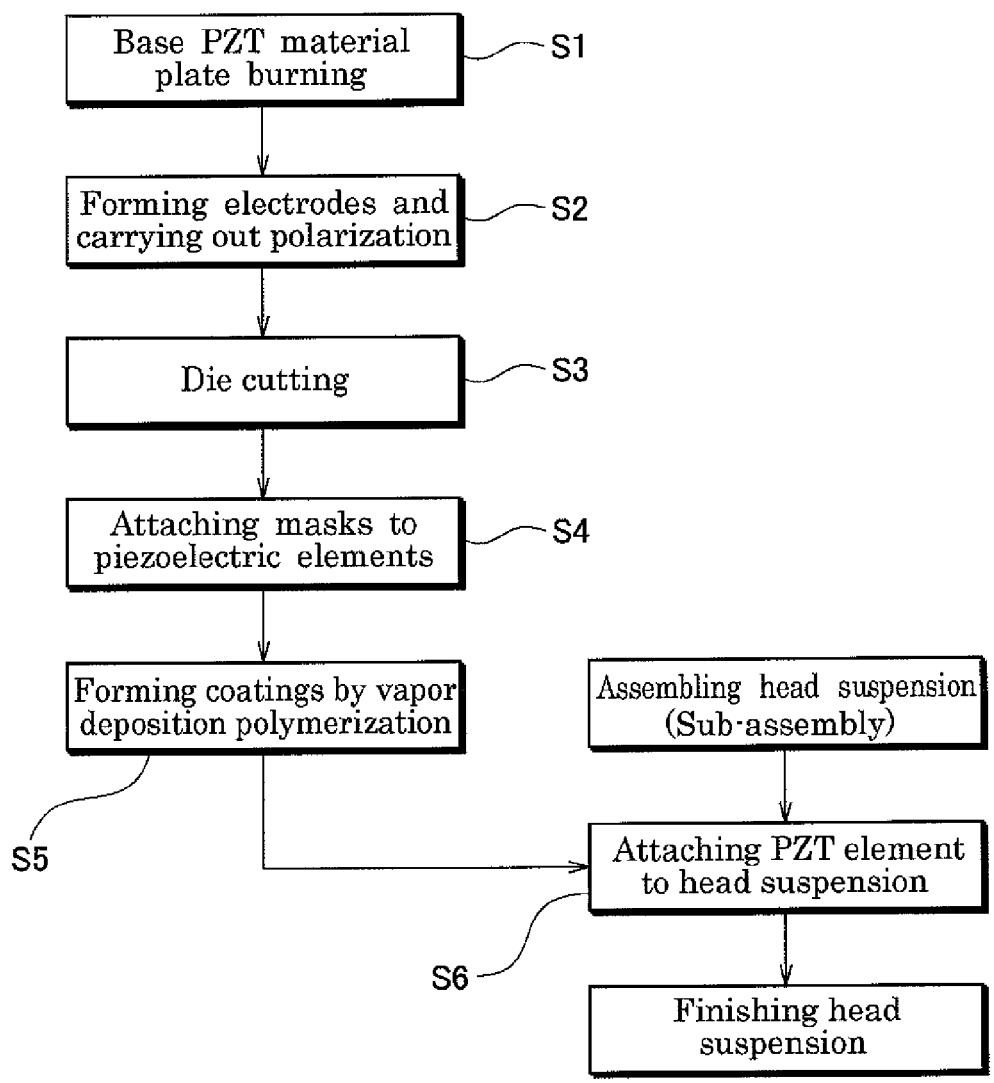

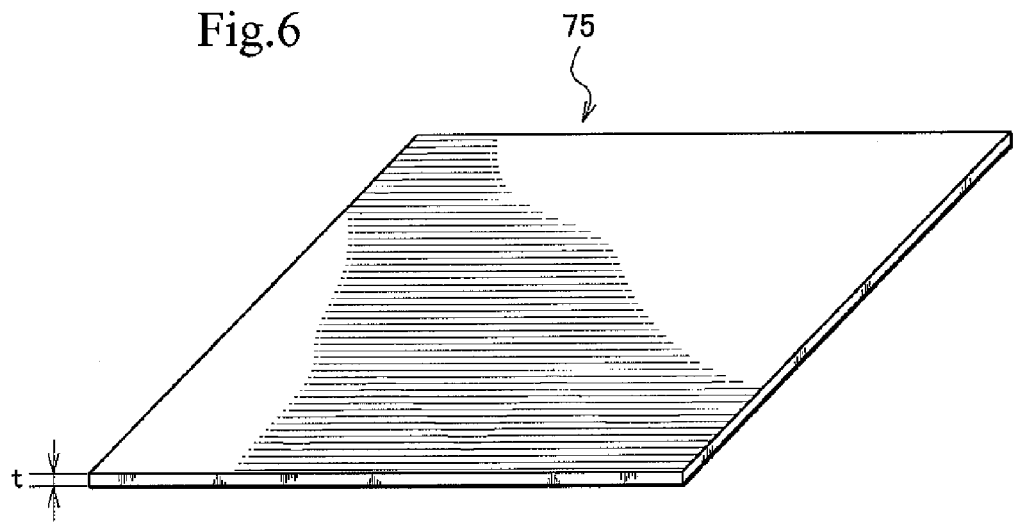
Fig.6    75
t
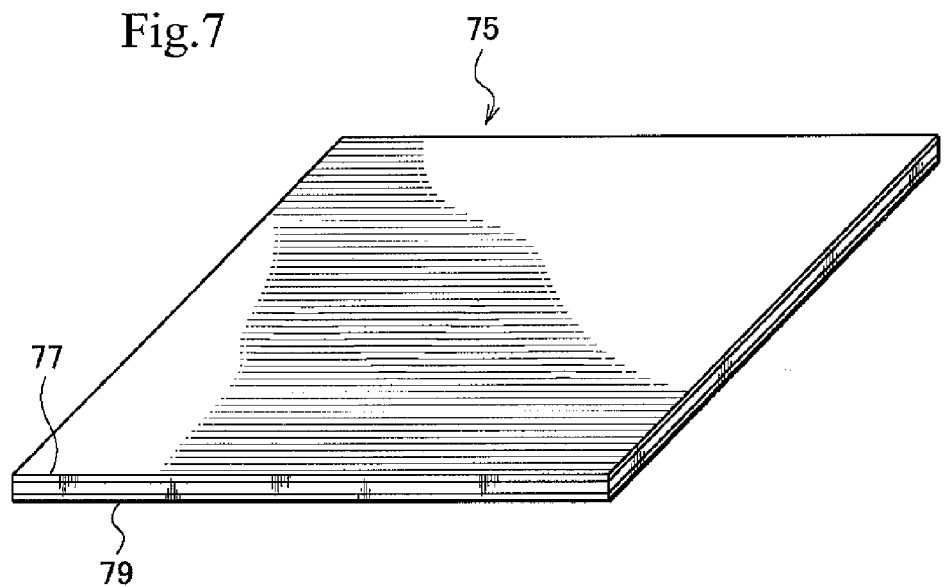
Fig.7    75
77
79

METHOD OF MANUFACTURING PIEZOELECTRIC ELEMENT

BACKGROUND OF THE INVENTION

1. Field of the Invention

The present invention relates to a method of manufacturing a piezoelectric element that deforms according to a voltage applied thereto, a manufactured piezoelectric element, a piezoelectric actuator with the piezoelectric element, and a head suspension with the piezoelectric actuator.

2. Description of Related Art

Small-sized, precision information devices are rapidly advancing, and for use with such devices, needs for micro-actuators capable of conducting positioning control for very small distances are increasing. Such micro-actuators are highly needed by, for example, optical systems for correcting focuses and inclination angles, ink-jet printers for controlling ink heads, and magnetic disk drives for controlling magnetic heads.

The magnetic disk drives increase storage capacity by increasing the number of tracks per inch (TPI), i.e., by narrowing the width of each track on a magnetic disk.

Large-capacity magnetic disk drives, therefore, need an actuator capable of precisely positioning the magnetic head within a minute range across tracks.

To meet the need, Japanese Unexamined Patent Application Publication No. 2002-184140 discloses a head suspension with a dual actuator system. The dual actuator system employs a piezoelectric actuator in addition to a usual voice coil motor that drives a carriage to which the head suspension is attached. The piezoelectric actuator includes a piezoelectric element arranged between a base plate and a load beam of the head suspension.

According to this related art, the voice coil motor turns the head suspension through the carriage, and in addition, the piezoelectric element deforms in proportion to a voltage applied thereto, to minutely move the magnetic head at the front end of the load beam in a sway direction (a widthwise direction of the load beam) relative to the base plate. The dual actuator system involving the voice coil motor and piezoelectric element is capable of precisely positioning the magnetic head to a target position on a magnetic disk.

In order to manufacture the piezoelectric element, the piezoelectric element is cut out from a base material first. When cutting the piezoelectric element, peripheral end faces are formed to define a peripheral shape of the piezoelectric element. It, however, is easy to produce particles from the cut peripheral end faces of the piezoelectric element. A head suspension with the piezoelectric element may damage a magnetic disk drive in which the head suspension is attached, so that the particles enter into a gap between a slider of a magnetic head and a magnetic disk rotating at high speed.

To cope this problem, International Patent Application Publication No. WO2009/099438 discloses a coating technique of peripheral end faces of a piezoelectric element when manufacturing it.

The related art cuts a base material to form a plurality of piezoelectric elements that are arranged in a grid and separated by grooves. Each groove defines a gap between opposing peripheral end faces of adjacent piezoelectric elements. The related art applies polymer to the gaps with use of an ink-jet method to form coatings on the peripheral end faces of each piezoelectric element, respectively.

The gap, however, is set about 50 μm that is too narrow to surely form the coatings on the opposing peripheral end faces of the adjacent piezoelectric elements with the ink-jet method. If the gap widens to surely form the coatings, it deteriorates material yield.

A piezoelectric element may be individually picked up to surely form coatings on peripheral end faces thereof. This deteriorates the production efficiency of piezoelectric elements, thereby complicating to form coatings.

SUMMARY OF THE INVENTION

An object of the present invention is to provide a method of manufacturing a piezoelectric element capable of easily and surely forming coatings on peripheral end faces of the piezoelectric element without deteriorating material yield, a piezoelectric element manufactured by the method, a piezoelectric actuator with the piezoelectric element, and a head suspension with the piezoelectric actuator.

In order to accomplish the object, an aspect of the present invention provides a method of manufacturing a piezoelectric element that deforms according to a voltage applied thereto. The method comprises steps of cutting a piezoelectric element out from a base piezoelectric material plate so that peripheral end faces are formed to define a peripheral shape of the piezoelectric element, and forming polymer coatings on at least objective areas of the peripheral end faces of the piezoelectric element by vapor deposition polymerization, respectively.

This aspect of the present invention easily and surely forms the polymer coatings on the peripheral end faces of the piezoelectric element in a gasified polymer atmosphere by the vapor deposition polymerization without deteriorating material yield.

BRIEF DESCRIPTION OF THE DRAWINGS

FIG. 5 is a flowchart illustrating a method of manufacturing the piezoelectric element according to the first embodiment of the present invention;

FIG. 6 is a perspective view illustrating a base piezoelectric material plate according to the first embodiment of the present invention;

FIG. 7 is a perspective view illustrating the base piezoelectric material plate in FIG. 6 with conductive metal layers;

DETAILED DESCRIPTION OF EMBODIMENTS

Embodiments of the present invention will be explained in detail with reference to the drawings. Each embodiment forms polymer coatings on at least objective areas of peripheral end faces of a piezoelectric element by vapor deposition polymerization, respectively. As a result, it easily and surely forms the polymer coatings on the peripheral end faces of the piezoelectric element without deteriorating material yield.

Figure 1:
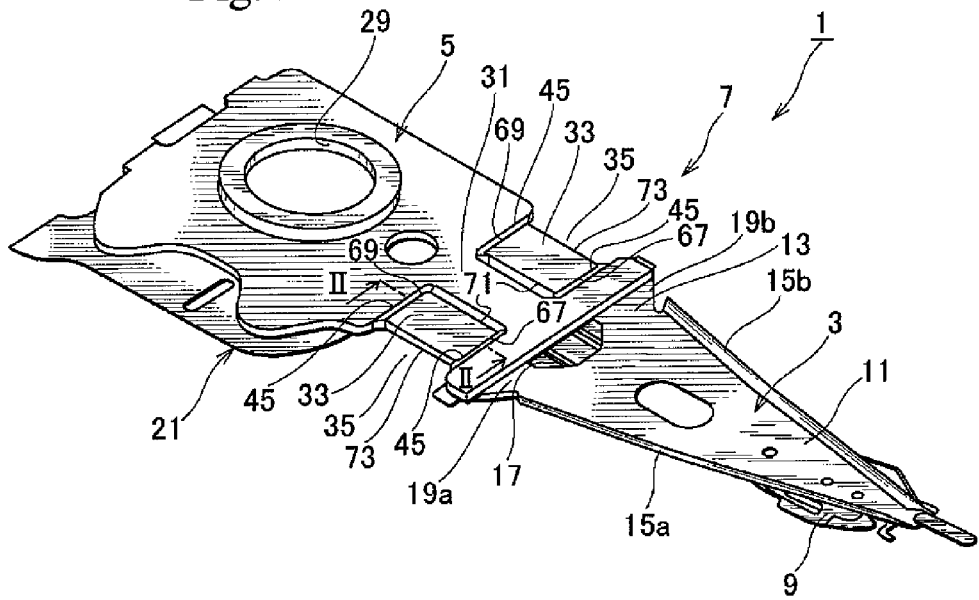
FIG. 1 is a perspective view illustrating an example of a head suspension having piezoelectric elements according to a first embodiment of the present invention.
Figure 2:
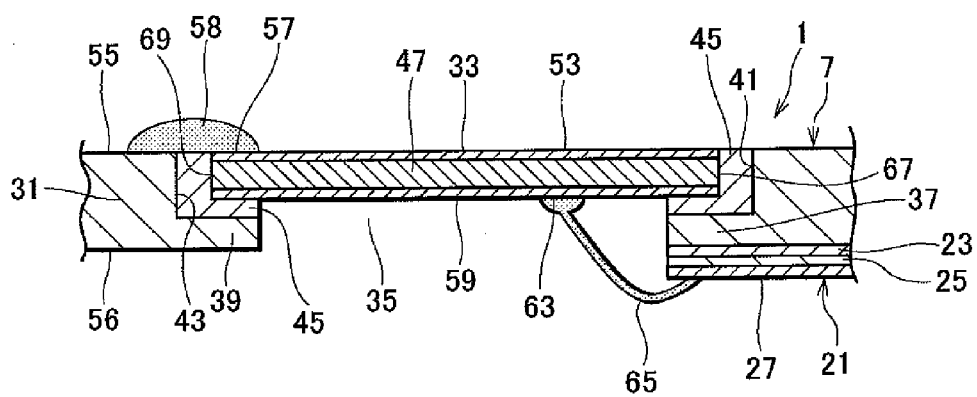
FIG. 2 is a sectional view taken along a line II-II of FIG. 1.
Figure 3:
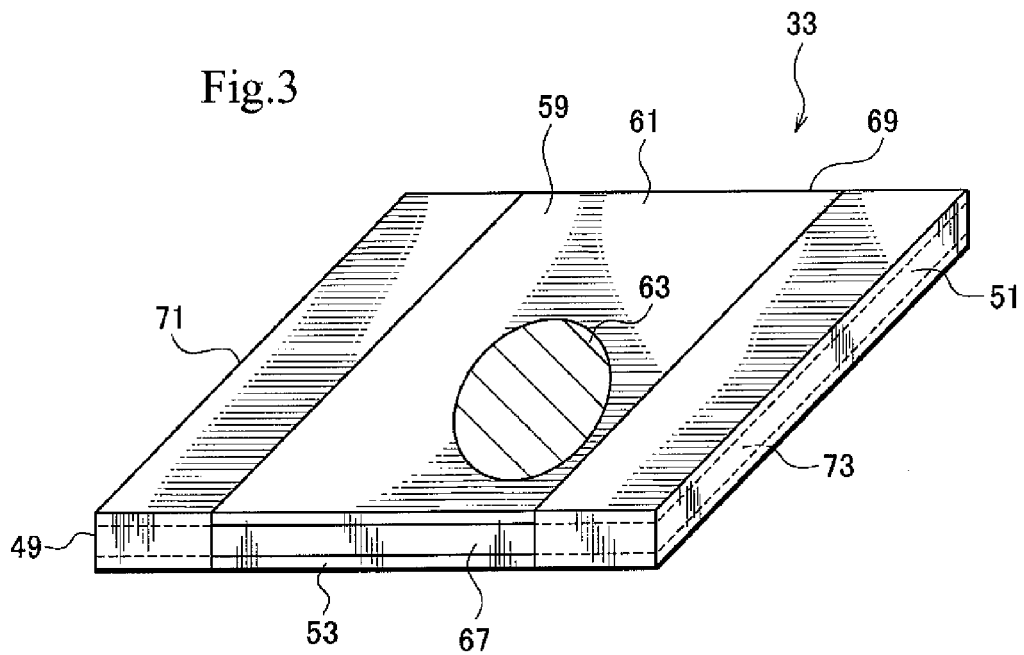
FIG. 3 is a schematic perspective view illustrating the piezoelectric element in FIG. 1 seen from a first side thereof.
Figure 4:
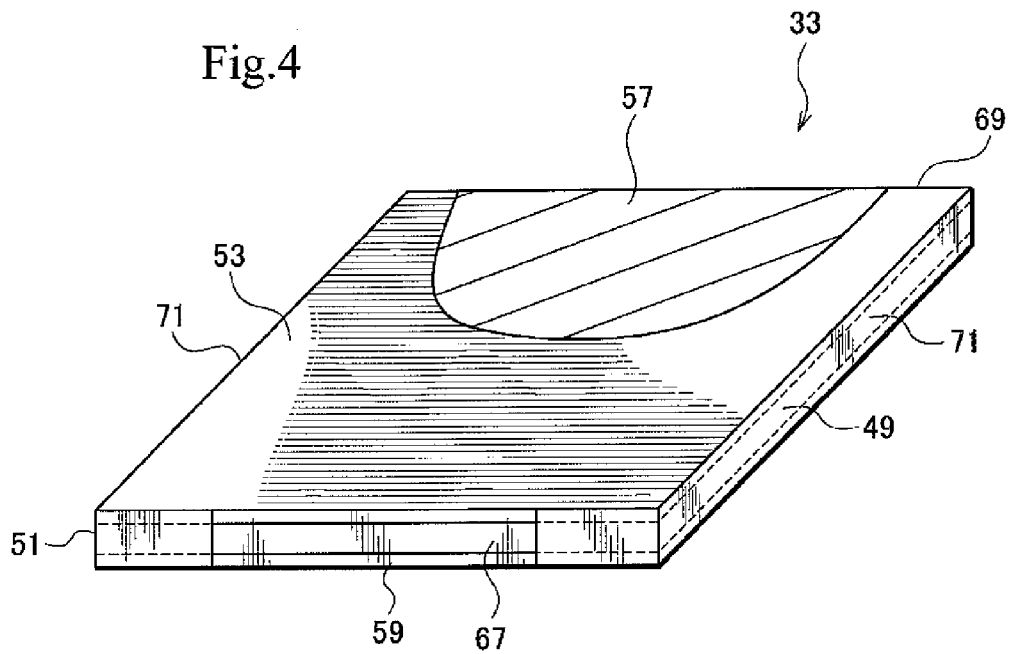
FIG. 4 is a schematic perspective view illustrating the piezoelectric element in FIG. 1 seen from a second side thereof.

FIG. 1 is a perspective view illustrating an example of a head suspension having piezoelectric elements according to a first embodiment of the present invention, FIG. 2 is a sectional view taken along a line II-II of FIG. 1, FIGS. 3 and 4 are schematic perspective views illustrating the piezoelectric element seen from opposing sides.

As illustrated in FIGS. 1 and 2, the head suspension 1 has a load beam 3 as a driven part, a base plate 5 as a base, and the piezoelectric actuator 7.

The load beam 3 applies load onto a read/write head 9 that is supported at a front end of the load beam 3. The load beam 3 includes a rigid part 11 and a resilient part 13. The rigid part 11 is made of a resilient metal thin plate such as resilient stainless steel thin plate having a thickness in the range of about 30 to 150 µm.

Along each edge of the rigid part 11 in a lateral direction thereof, bends 15a and 15b rise and extend from a front end to a base end of the rigid part 11 in a longitudinal direction thereof, to improve the rigidity of the rigid part 11. The base end of the rigid part 11 is integral with the resilient part 13.

The resilient part 13 has a through window 17 and legs 19a and 19b formed on each side of the window 17. The resilient part 13 may be formed separately from the rigid part 11 and be fixed to thereto by, for example, laser welding.

To the load beam 3, a flexure 21 is attached as a wiring member. The flexure 21 includes a conductive substrate 23 made of, for example, a resilient stainless steel thin rolled plate (SST). The substrate 23 has a thickness in the range of about 10 to 25 µm. The flexure 21 also includes an insulating layer 25 formed on the substrate 23 and a wiring pattern 27 formed on the insulating layer 25. The wiring pattern 27 is used for signal transmission and power feeding.

The flexure 21 is fixed to the load beam 3 by, for example, laser welding and extends at least along the head suspension 1 from the base plate 5 to the front end of the load beam 3. A front end of the flexure 21 is arranged on the front end of the load beam 3 and supports a slider (not shown) of the head 9. The slider of the head 9 is electrically connected to an end of the wiring pattern 27 of the flexure 21.

The load beam 3 is supported with the base plate 5. According to the embodiment, a base end of the load beam 3 corresponding to a base end of the resilient part 13 is supported with the base plate 5.

The base plate 5 is made of a metal thin plate such as stainless steel thin plate having a thickness in the range of about 150 to 200 µm. The base plate 5 has a circular boss 29. With the boss 29, the base plate 5 is attached to a carriage (not illustrated) that is turned by a voice coil motor (not illustrated). Between the base plate 5 and the load beam 3, the piezoelectric actuator 7 is arranged.

The piezoelectric actuator 7 has an actuator base 31 and a pair of piezoelectric elements 33. When a voltage is applied to the piezoelectric elements 33, the piezoelectric elements 33 deform to displace the load beam 3, thereby minutely move the head 9 relative to the base plate 5 in a sway direction (a width direction of the load beam 3) through the load beam 3.

The actuator base 31 is integral with a front end of the base plate 5. The actuator base 31 may be formed separately from the base plate 5 and be fixed to the base plate 5 by, for example, laser welding.

The actuator base 31 includes a pair of openings 35 on both sides in a lateral direction of the actuator base 31, respectively. Each opening 35 has a rectangular shape, is formed through the actuator base 31 in a thickness direction of the actuator base 31, is open to a lateral side of the actuator base 31, and is provided with receivers 37 and 39.

Incidentally, the piezoelectric actuator 7 including the actuator base 31 is the component of the head suspension 1 as well as the load beam 3 and base plate 5, and therefore, the width or lateral directions of the piezoelectric actuator 7, load beam 3 and base plate 5 correspond to a width or lateral direction of the head suspension 1. Similarly, the longitudinal directions of the piezoelectric actuator 7, load beam 3 and base plate 5 correspond to the longitudinal direction of the head suspension 1.

The receivers 37 and 39 are formed by, for example, partially etching the actuator base 31 at inner edges of the opening 35, so that the receivers 37 and 39 are integral with flat inner faces 41 and 43 of the opening 35. The receivers 37 and 39 inwardly protrude from the inner faces 41 and 43 in a longitudinal direction of the head suspension 1. The receivers 37 and 39 are placed, in the thickness direction of the actuator base 31, closer to a surface 56 of the actuator base 31 to define the inner edges of the opening 35 on the surface 56. The surface 56 faces a disk of a magnetic disk drive when the head suspension 1 is attached to the magnetic disk drive.

The receivers 37 and 39 may be formed by a receiver member prepared separately from the actuator base. The receiver member may be integral with the load beam and be laid on the actuator base to form the receivers to the opening.

The piezoelectric element 33 is received in and attached to the opening 35 of the actuator base 31 with an adhesive 45. The piezoelectric element 33 includes element body 47 and polymer coatings 49 and 51 as illustrated in FIGS. 1 to 4. The polymer coatings 49 and 51 are hereinafter referred to simply as "coatings".

The element body 47 is made of piezoelectric ceramics such as PZT (lead zirconate titanate) and deforms according to a voltage applied thereto in the longitudinal direction of the head suspension 1. The longitudinal direction of the head suspension 1 corresponds to a deformation direction of the piezoelectric element 33 and a lateral direction of the head suspension 1 corresponds to a direction orthogonal to the deformation direction of the piezoelectric element 33. The direction orthogonal to the deformation direction is hereinafter also referred to as "orthogonal direction".

The element body 47 has a rectangular shape that is slightly smaller than the shape of the opening 35 of the actuator base 31 and has a thickness in the range of about 70 to 200 µm.

The element body 47 has a first electrode 53 formed on a first surface thereof. The first electrode 53 is made of a conductive metal plate such as gold plate. The first electrode 53 has an exposed surface that entirely exposes outside and is substantially flash with a surface 55 of the actuator base 31. The surface 55 is opposite to the surface 56.

The first electrode 53 has a connecting area 57 defined at a part of the exposed surface of the first electrode 53. The connecting area 57 is electrically connected to the surface 55 of the actuator base 31 with a conductive paste 58.

Through the conductive paste 58, the piezoelectric element 33 is grounded to the actuator base 31. Namely, the actuator base 31 serves as an other member in order to apply a voltage to the piezoelectric element 33.

The element body 47 has a second electrode 59 formed on a second surface thereof. The second electrode 59 is made of a conductive metal plate such as gold plate like the first electrode 53. The second electrode 59 has lateral side portions that are covered with the coatings 49 and 51, respectively. The coatings 49 and 51 will be explained later in detail.

The second electrode 59 has an exposed surface that partly exposes outside in the lateral middle portion and defines an exposed portion 61 between the lateral side portions. At a central region in the exposed portion 61, a connecting are 63 is defined to be connected to the wiring pattern 27 of the flexure 21.

The second electrode 59 includes end portions in the longitudinal direction of the head suspension 1. The end portions of the second electrode 59 face the receivers 37 and 39 and are received by the receivers 37 and 39 through the adhesive 45. The exposed portion 61 of the second electrode 59, therefore, is disposed between the receivers 37 and 39 to face toward the disk of the magnetic disk drive.

The connecting area 63 on the exposed portion 61 is electrically connected to the wiring pattern 27 of the flexure 21 by, for example, a bonding wire 65. A conductive adhesive or paste may be used instead of the bonding wire 65. The electric connection of the second electrode 59 enables to supply electric power to the piezoelectric element 33 together with the electric connection of the first electrode 53 through the first and second electrodes 53 and 59. Namely, the flexure 21 serves as an other member in order to apply a voltage to the piezoelectric element 33.

The element body 47 has peripheral end faces 67, 69, 71, and 73 on the periphery thereof. The end faces 67 and 69 are on opposite sides in the longitudinal direction of the head suspension 1. The end faces 67 and 69 are flat, face the inner faces 41 and 43 of the opening 35 and are fixed thereto through the adhesive 45, respectively. The end faces 67 and 69 are hereinafter also referred to as longitudinal end faces.

The end faces 71 and 73 are on opposite sides in the lateral direction of the head suspension 1. The end faces 71 and 73 are hereinafter also referred to as lateral end faces.

The coatings 49 and 51 are formed on the end faces 71 and 73 and cover them, respectively. The coatings 49 and 51 are made of, for example, polyurea or parylene (poly-para-xylene polymer) through vapor deposition polymerization. The coatings 49 and 51 have a thickness of, for example, about 1 μm.

The coatings 49 and 51 symmetrically extend to a part of the second electrode 59 and the end faces 67 and 69 from the lateral end faces 71 and 73. In particular, the coating 49 (51) is continuously formed on the lateral side portion of the second electrode 59 and at least lateral side portions of the end faces 67 and 69 corresponding to the lateral side portion of the second electrode 59.

The adhesive 45 is a nonconductive liquid adhesive that is filled and solidified in a space between the piezoelectric element 33 and the opening 35, i.e., spaces between the longitudinal end faces 67 and 69 of the piezoelectric element 33 and the inner faces 41 and 43 of the opening 35. The adhesive 45 is also filled and solidified in spaces between the piezoelectric element 33 and the receivers 37 and 39. As the adhesive 45, known nonconductive adhesive may be used.

The adhesive 45 buries the spaces between the piezoelectric element 33 and the opening 35 and the receivers 37 and 39, to fix the piezoelectric element 33 to the actuator base 31 and secure insulation and deformation (driving force) transfer between the piezoelectric element 33 and the actuator base 31. Furthermore, the adhesive 45 serves as coatings covering the longitudinal end faces 67 and 69 of the piezoelectric element 33.

According to the first embodiment, the longitudinal end faces 67 and 69 are covered with the adhesive 45 and the lateral end faces 71 and 73 are covered with the coatings 49 and 51. It therefore prevents all end faces 67, 69, 71 and 73 of the piezoelectric element 33 from producing particles.

The above-identified dimensions, configurations and the like of the head suspension 1 is the example to which the piezoelectric element 33 manufactured according to the first embodiment is attached. Other dimensions, configurations and the like of the head suspension according to commonly-known technique may be employed for attaching the piezoelectric element manufactured according to the present invention. For example, the head suspension may have one opening to receive the piezoelectric element according to commonly-known technique.

A method of manufacturing the piezoelectric element according to the first embodiment will be explained.

FIG. 5 is a flowchart illustrating the method of manufacturing the piezoelectric element 33. The flowchart indicates all steps from manufacturing the piezoelectric element 33 to attaching the piezoelectric element 33 to the head suspension 1.

The method includes a step S1 carrying out a base PZT material plate burning as a base material plate forming step, a step S2 forming electrodes and carrying out polarization as an electrode forming step, a step S3 carrying out die cutting as a cutting step, a step S4 attaching masks to piezoelectric elements as a covering step, a step S5 forming coatings by vapor deposition polymerization as a coating forming step, and a step S6 attaching a PZT element as an attaching step.

In the step S1, powder material of PZT as piezoelectric material is pressed by a mold while rising temperature to sinter the powder material and form a burned base material plate 75 of PZT (burned base piezoelectric material plate).

FIG. 6 is a perspective view illustrating the burned base piezoelectric material plate.

As illustrated in FIG. 6, the base material plate 75 has a rectangular shape and thickness of about 100 μm. After the burning of the base material plate 75, the method shifts to the step S2.

FIG. 7 is a perspective view illustrating the base piezoelectric material plate 75 in FIG. 6 with conductive metal layers 77 and 79.

As illustrated in FIG. 7, the step S2 in FIG. 5 forms the conductive metal layers 77 and 79 on opposite sides of the material plate 75. According to the embodiment, the step S2 forms conductive metal layers 77 and 79 on opposite surfaces of the material plate 75 by, for example, vapor deposition, sputtering, plating, or applying metal paste, respectively.

After forming the conductive metal layers 77 and 79, the polarization is carried out to the material plate 75. Namely, high direct voltage is applied to the material plate 75 as a ferroelectric through the conductive metal layers 77 and 79, to conduct voltage activation to the material plate 75.

When carrying out the polarization, the application of the high voltage is conducted in silicon oil or in a gas atmosphere with high insulation. The polarization may be carried out with use of corona discharge. After the polarization, the method shifts to the step S3.

Figure 8:
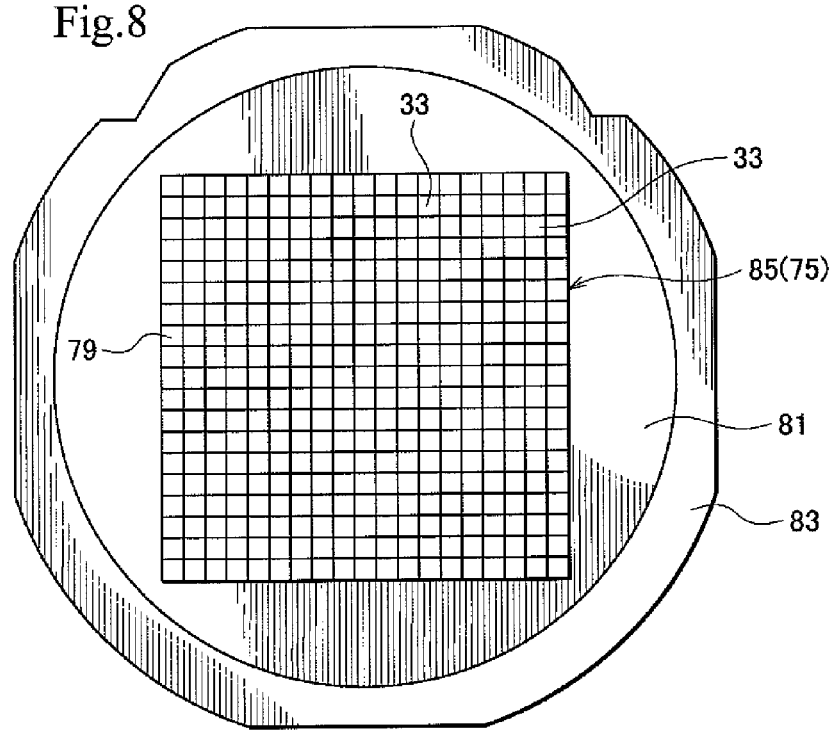
FIG. 8 is a plan view illustrating a plurality of piezoelectric elements cut out from the base piezoelectric material plate in FIG. 7.
Figure 9:
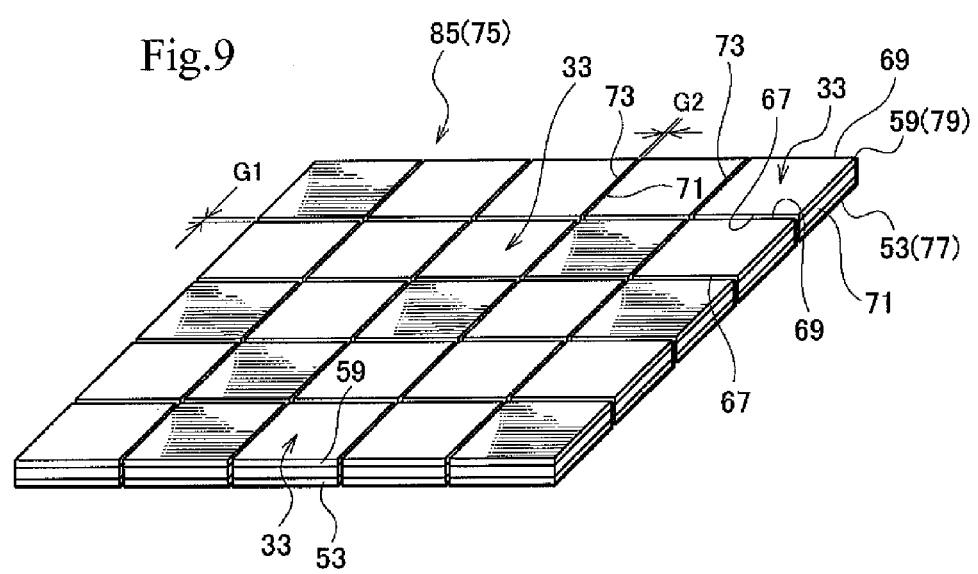
FIG. 9 is a perspective view partly illustrating the piezoelectric elements in FIG. 8.

FIG. 8 is a plan view illustrating a plurality of piezoelectric elements 33 cut out from the material plate 75 in FIG. 7 and FIG. 9 is a perspective view partly illustrating the piezoelectric elements 33 in FIG. 8.

The step S3 in FIG. 5 as a part of the covering step attaches a die cutting tape 81 as a holding sheet to one of the opposite sides of the material plate 75 to cover the corresponding one of the conductive metal layers 77 and 79 as illustrated in FIGS. 8 and 9. According to the embodiment, the die cutting tape 81 covers the conductive metal layer 77. The die cutting tape 81 is held by a die cutting frame 83.

The die cutting tape 81 may be attached to the other of the opposite sides of the material plate 75 to cover the conductive metal layer 79. In this case, the following steps may be applied while transposing the conductive metal layer 77 and relevant description thereto to the conductive metal layer 79 and relevant description.

Then, the step S3 as the cutting step cuts a piezoelectric element 33 out from the material plate 75 so that the peripheral end faces 67, 69, 71 and 73 are formed to define the peripheral shape of the piezoelectric element 33. At this time, the conductive metal layers 77 and 79 are cut together with each piezoelectric element 33 as the first and second electrodes 53 and 59. According to the embodiment, a plurality of piezoelectric elements 33 are cut out from the material plate 75 with use of a die cutter or die cutting saw (not shown).

The cutting of the piezoelectric elements 33 is carried out so that the elements 33 are arranged at least side by side in line along the deformation direction, thereby forming an in-line element set. The in-line element set includes two or more piezoelectric elements. The adjacent elements 33 in the same in-line element set define a gap G1 between the opposing longitudinal end faces 67 and 69 thereof in the deformation direction.

It is preferable to form two or more in-line element sets. According to the embodiment, a plurality of in-line element sets are arranged side by side with a gap G2 in the orthogonal direction so that all the piezoelectric elements 33 are arranged in a grid. The gap G2 is defined between adjacent in-line element sets, in particular, between the opposing lateral end faces 71 and 73 of the adjacent in-line element sets. The gaps G2 and G1 each have a width of about 50 µm.

After the cutting, the method shifts to the step S4 while holding the piezoelectric elements 33 on the die cutting tape 81 in the form of a held set 85.

Figure 10:
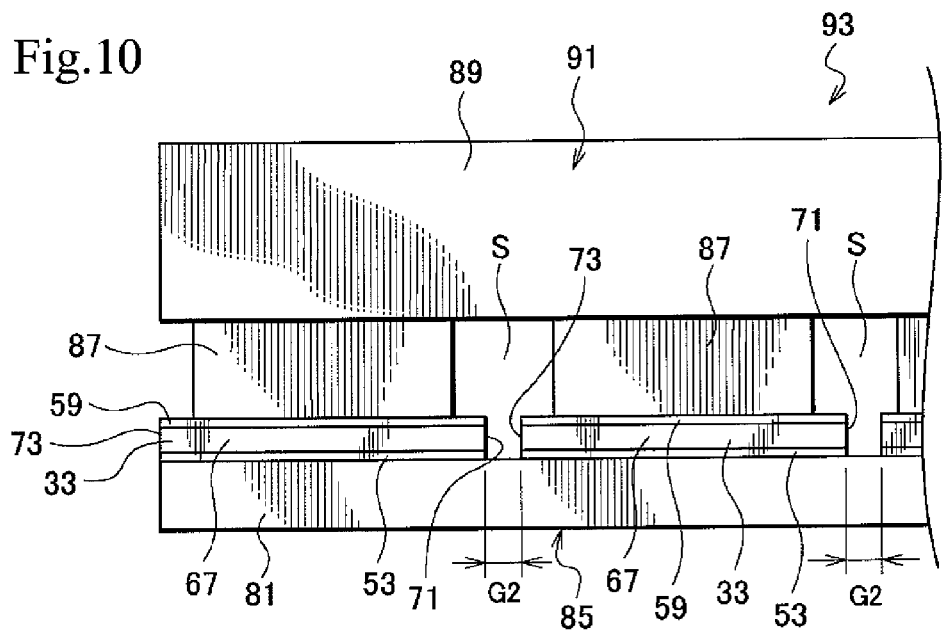
FIG. 10 is a side view partly illustrating the piezoelectric elements in FIG. 8 with masks on a mask jig attached thereto.
Figure 11:
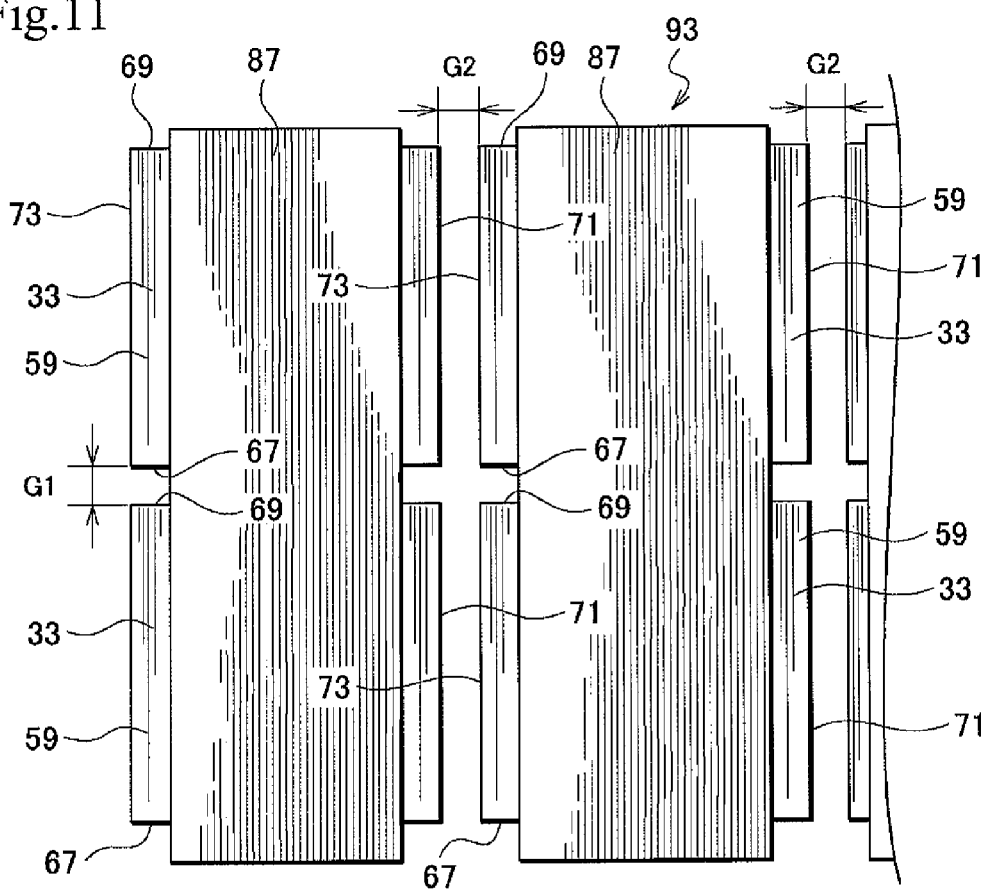
FIG. 11 is a plan view illustrating the piezoelectric elements and the masks in FIG. 10.

FIG. 10 is a side view partly illustrating the piezoelectric elements 33 in FIG. 8 with masks 87 on a mask jig 91 attached thereto and FIG. 11 is a plan view illustrating a relationship between the piezoelectric elements 33 and the masks 87 of FIG. 10.

The step S4 in FIG. 5 as a part of the covering step places or attaches a plurality of the masks 87 on the plurality of the in-line element sets as illustrated in FIGS. 10 and 11, respectively. Each mask 87 is a band and extends over the piezoelectric elements 33 in the same in-line element set along the deformation direction. The masks 87 are prepared as a mask jig.

The mask jig 91 includes a mask body 89 and the a plurality of the masks 87 that are arranged on the mask body 89. The plurality of the masks 87 on the mask body 89 correspond to the plurality of the in-line element sets, respectively. When placing each mask 87 on each in-line element set, the mask jig 91 is brought closer to the held set 85 so that each mask 87 comes into contact with the second electrodes 59 of the piezoelectric elements 33 in the corresponding one of the plural in-line element set.

According to the embodiment, the mask 87 is narrower than the dimension in the orthogonal direction and passes over the lateral middle portions of the piezoelectric elements 33. That is, the mask 87 covers at least the connecting areas 63 of the second electrodes 59 of the piezoelectric elements 33 in the same in-line element set.

The mask jig 91 has spaces S each defined between adjacent masks 87. The space S is placed over and communicates with the corresponding one of the gaps G2 in the thickness direction of the piezoelectric element 33 or the held set 85. With this, the space S forms a closed section together with the gap G2 and enlarges the closed gap G2. By attaching the masks 87 to the held set 85, a masked set 93 is prepared and the method shifts to the step S5.

Figure 12:
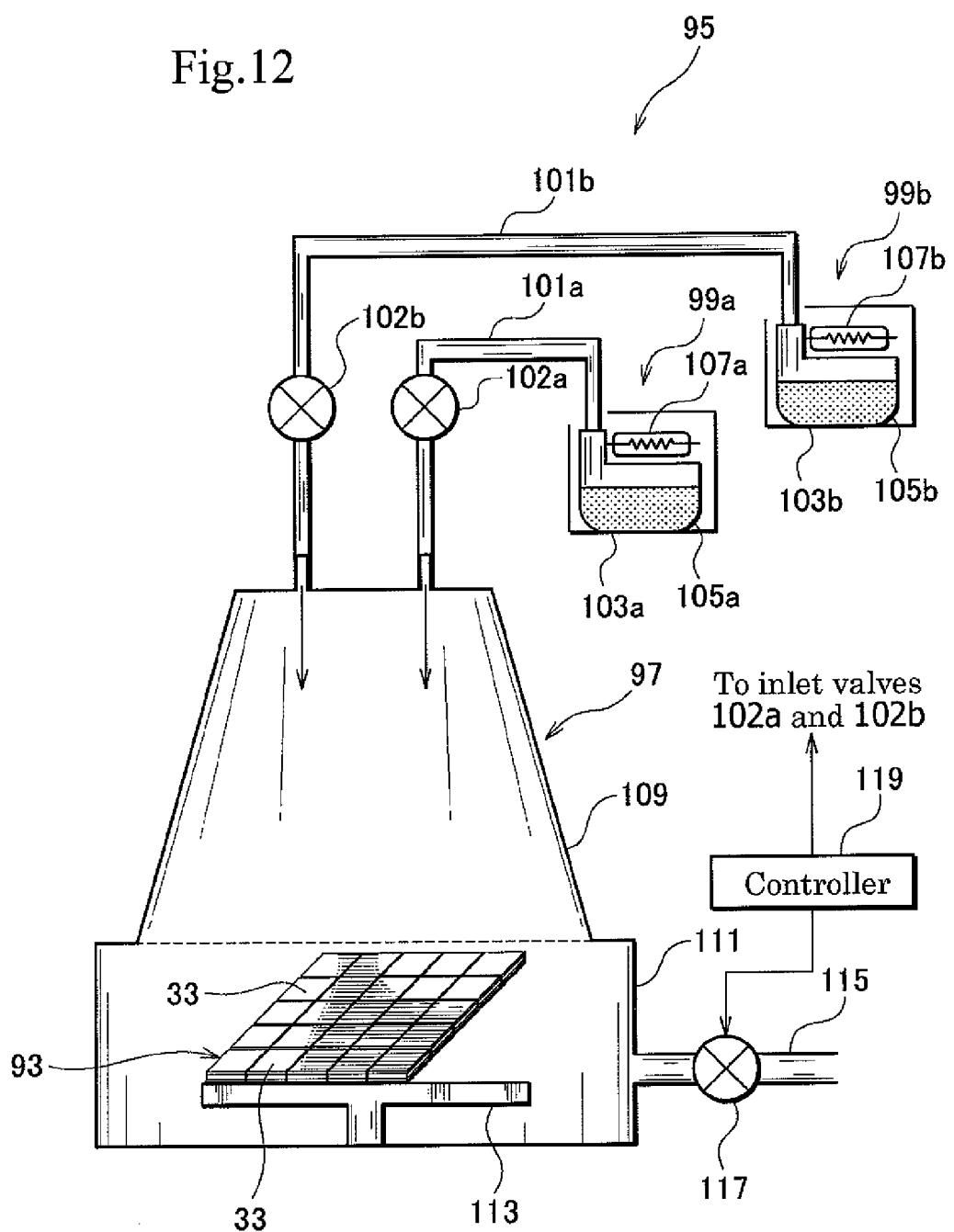
FIG. 12 is a schematic view illustrating a vapor deposition polymerization unit according to the first embodiment of the present invention.

FIG. 12 is a schematic view illustrating a vapor deposition polymerization unit 95.

In the step S5 of FIG. 5, the vapor deposition polymerization unit 95 in FIG. 12 is used for forming the coatings 49 and 51 by vapor deposition polymerization. The coatings 49 and 51 are formed on the lateral end faces 71 and 73 of each piezoelectric element 33 in the masked set 93 in FIGS. 10 and 11.

The vapor deposition polymerization unit 95 carries out the vapor deposition polymerization according to physical vapor deposition (PVD). The unit 95 includes a polymerization chamber 97 accommodating the masked set 93 as an object.

A pair of gasifiers 99a and 99b are connected to the polymerization chamber 97 through a pair of inlet pipes 101a and 101b, respectively. The gasifiers 99a and 99b gasify and feed two different monomers into the polymerization chamber 97 through the inlet pipes 101a and 101b.

The gasifier 99a (99b) includes a housing 103a (103b), a monomer container 105a (105b), and a heater 107a (107b). The housing 103a (103b) is provided with the monomer container 105a (105b) and the heater 107a (107b) inside. The monomer container 105a contains monomer to be gasified by heat with the heater 107a (107b).

As the two different monomers for the coatings 49 and 51 made of polyurea according to the embodiment, diisocyanate compound such as 4,4'-diphenylmethanediisocyanate (MDI) is contained in the container 105a and diamine compound such as 4,4'-diaminodiphenylmethane (MDA) is contained in the container 105b.

For the coatings 49 and 51 made of parylene according to an alternative embodiment, only paraxylene monomer such as diparaxylene (DPX) is contained in one of the containers 105a and 105b.

The inlet pipe 101a (101b) has an inlet valve 102a (102b) that is opened and closed during the vapor deposition polymerization. With the valve operation of the inlet valves 102a and 102b, the vapor deposition polymerization unit 95 controls the thicknesses of the coatings 49 and 51.

The polymerization chamber 97 includes a monomer mixing tank 109 and a reaction tank 111 that communicate with each other. The monomer mixing tank 109 mixes the fed monomers to further feed the reaction tank 111. The reaction tank 111 carries out reaction of the vapor deposition polymerization to the lateral end faces 71 and 73 of each piezoelectric element 33 of the masked set 93 with the mixed monomer.

The reaction tank 111 has a table on which the masked set 93 is placed. The reaction tank 111 is connected to an outlet pipe 115 to discharge gas in the reaction tank 111 after the vapor deposition polymerization.

The outlet pipe 115 has an outlet valve 117 that is opened and closed at a predetermined timing. The outlet valve 117 and inlet valves 102a and 102b are connected to a controller 119. The controller 119 controls the valves 117, 102a and 102b to be opened and closed as well as sequence control of the vapor deposition polymerization.

The controller 119 controls the inlet valves 102*a* and 102*b* are opened in a predetermined time to carry out the vapor deposition polymerization to the masked set 93 placed on the table 113 in the polymerization chamber 97.

A temperature for this polymerization is set as a temperature in which each piezoelectric element 33 keeps a polarity thereof. According to the embodiment, the temperature is set in a range of about ½ to ⅓ of Curie point. At this time, the polymerization chamber 97 has an atmosphere condition like a high vacuum according to vacuum vapor deposition or an inert gas according to the embodiment.

Due to the vapor deposition polymerization, the gasified monomers polymerize and form the coatings 49 and 51 on at least objective areas of the peripheral end faces 67, 69, 71 and 73 of each piezoelectric element 33 of the masked set 93 other than the area on which the mask 87 is placed.

In particular, the gasified monomers enter into the spaces S of the mask jig 91 and the gaps G2 that communicate with the spaces S. The gasified monomers entering into the spaces S and gaps G2 evaporate on the lateral end faces 71 and 73 and the surface of the second electrode 59 that faces the space S of each piezoelectric element 33 as the coatings 49 and 51.

In this way, the method of the first embodiment carries out the vapor deposition polymerization that gasifies monomer by heat and polymerizes the gasified monomer on the peripheral end faces 71 and 73 of each piezoelectric element 33, to form the coatings 49 and 51 in a gasified polymer atmosphere by the vapor deposition polymerization. Even if each gap G2 is extremely narrow and is about 50 μm, it surely forms the uniformly thin coatings 49 and 51 on the lateral end faces 71 and 73 of each piezoelectric element 33.

Furthermore, each gap G2 communicates with the corresponding one of the spaces S of the mask jig 91 in the thickness direction of the piezoelectric element 33 or masked set 93. The gasified monomers surely and easily enter into the gap G2 through the space S so that the gasified monomers are polymerized on the lateral end faces 71 and 73 of each piezoelectric element 33 to surely form the coatings 49 and 51 thereon.

The gap G2 forms the closed section together with the space S, so that the gasified monomers are guided along the gap G2 and space S to surely form the coatings 49 and 51.

On the other hand, each gap G1 between the opposing longitudinal end faces 67 and 69 of the adjacent piezoelectric element 33 in the deformation direction is closed by the mask 87 so as not to communicate with the space S in the thickness direction. The gap G1 is insufficient to form coatings on the longitudinal end faces 67 and 69.

The longitudinal end faces 67 and 69, however, are covered with the adhesive 45 when the piezoelectric element 33 is attached to the head suspension 1. There is no need to form coatings on the longitudinal end faces 67 and 69. According to the embodiment, lateral portions of the gap G1 communicates with the space S in the thickness direction. Within this range, the coatings 49 and 51 are formed on the opposing longitudinal end faces 67 and 69.

The coatings 49 and 51 are uniformly thin so that they do not affect deformation characteristic of the piezoelectric element 33. According to the embodiment, the coatings 49 and 51 continuously extend from the lateral end faces 71 and 73 to the lateral portions on the second electrode 59 and longitudinal end faces 67 and 69, to improve rigidity of the coatings 49 and 51.

The coatings 49 and 51 are not formed on the area of the second electrode 59 of the piezoelectric element 33 on which the mask 87 is placed to form the exposed portion 61, so that the connecting area 63 is defined within the exposed portion 61 to be connected to the flexure 21.

The first electrode 53 of the piezoelectric element 33 is covered with the die cutting tape 81 as a mask 81 to entirely define the exposed portion.

After the coatings 49 and 51 are formed, the method shifts to the step S6.

The step S6 prepares a sub-assembled head suspension without the piezoelectric element 33 and attaches the piezoelectric element 33 to each opening 35 of the actuator base 31. Namely, the adhesive 45 is applied to the inner faces 41 and 43 of the opening 35 and the receivers 37 and 39 and then the piezoelectric element 33 is received in the opening 35.

With this, the longitudinal end faces 67 and 69 of the piezoelectric element 33 are covered with the adhesive 45 and the head suspension 1 has the piezoelectric element 33 with all the end faces 67, 69, 71 and 73 covered.

To the piezoelectric element 33 on the head suspension 1, the connecting area 57 of the first electrode 53 is connected to the surface 55 of the actuator base 31 with the conductive paste 58 and the connecting area 63 of the second electrode 59 is connected to the wiring pattern 27 of the flexure 21 with the bonding wire 65.

In this way, the piezoelectric element 33 is manufactured and attached to the piezoelectric actuator 7 or the head suspension 1.

Effects of the embodiments will be summarized.

The method of manufacturing the piezoelectric element 33 according to the first embodiment including steps of cutting the piezoelectric element 33 out from the base piezoelectric material plate 75 so that peripheral end faces 67, 69, 71 and 73 are formed to define the peripheral shape of the piezoelectric element 33 (carrying out the die cutting as the cutting step of the step S3), and forming the polymer coatings 49 and 51 on at least objective areas, i.e., lateral end faces 71 and 73 of the peripheral end faces 67, 69, 71 and 73 of the piezoelectric element 33 by the vapor deposition polymerization, respectively (forming the coatings by vapor deposition polymerization as the coating forming step of the step S5).

Even if the plurality of the piezoelectric element 33 are cut out from the material plate 75, the coatings 49 and 51 are surely formed on the lateral end faces 71 and 73 of each piezoelectric element 33 in the gasified polymer atmosphere while the adjacent piezoelectric elements 33 are closer to each other.

As a result, the method easily and surely forms the coatings 49 and 51 on the lateral end faces 71 and 73 of the piezoelectric element 33 without deteriorating material yield.

The coatings 49 and 51 are uniformly thin to suppress affecting the deformation of the piezoelectric element 33 while keeping the rigidity of the coatings 49 and 51.

The coating forming step is carried out at the temperature in which the piezoelectric element 33 keeps the polarity thereof, so that it surely obtains the piezoelectric elements 33 without wasters and suppresses deteriorating material yield.

The temperature is set in a range of ½ to ⅓ of Curie point, so that it secures the polarity of the piezoelectric element 33 and surely suppresses deteriorating material yield.

According to the first embodiment, the polymer coating 49 (51) is made of polyurea or parylene, so that it realizes the vapor deposition polymerization at the temperature set in the range of ½ to ⅓ of Curie point.

The method according to the embodiment further includes steps of forming electrodes 53 and 59 on opposite sides of the piezoelectric element 33, respectively (forming electrodes 53 and 59 and carrying out polarization as the electrode forming step S2), each electrode 53 (59) to be connected to the other member that is actuator base 31 (the flexure 21) in order to apply a voltage to the piezoelectric element 33, and covering the connecting area 57 (63) on each electrode to the other member with the mask 81 (87), to avoid the connecting area 57 (63) from the vapor deposition polymerization.

The electrode 53 (59) is surely electrically connected to the actuator base 31 (the flexure 21) while forming the coatings 49 and 51 on the lateral end faces 71 and 73 by the vapor deposition polymerization.

The cutting step cuts the material plate 75 so that the plurality of piezoelectric elements 33 are arranged at least in line along the deformation direction of the piezoelectric element 33, thereby forming an in-line element set, and the covering step places the mask 87 on the in-line element set so that the mask 87 extends over the piezoelectric elements 33 in the in-line element set along the deformation direction.

The method, therefore, easily and surely places the mask 87 on the piezoelectric elements 33 without masks that are placed on the piezoelectric elements 33, respectively.

According to the embodiment, the plurality of in-line element sets are arranged side by side with a gap G2 between adjacent in-line element sets, and the vapor deposition polymerization is carried out through the gap G2.

The coatings 49 and 51 are easily and surely formed on each of the plurality of piezoelectric elements 33.

Furthermore, the masks 87 are simultaneously placed on the plurality of in-line element sets with use of the mask jig 91 or the like, to easily and surely realize the covering step.

The plurality of masks 87 are arranged on the mask body 89 and correspond to the plurality of the in-line element sets, respectively, and the space S is set between adjacent masks 87 to communicate with the corresponding one of the gaps G2 between the adjacent in-line element sets when the covering step is carried out.

The space S allows the gasified monomers to easily and surely enter into the gap G2, to form the coatings 49 and 51 on the lateral end faces 71 and 73 of each piezoelectric element 33.

Furthermore, the space S forms the closed section together with the gap G2 to guide the gasified monomers along the gap G2 and space S. This results in surely forming the coatings 49 and 51.

The electrode forming step forms conductive metal layers 77 and 79 on opposite sides of the material plate 75, the conductive metal layers 77 and 79 being cut together with the piezoelectric element 33 as the electrodes 53 and 59 in the cutting step. The cutting step attaches the die cutting tape 81 to one of the opposite sides of the material plate 75 to cover the corresponding one of the conductive metal layers 77 and 79 and cuts the material plate 75 out on the die cutting tape 81. The covering step attaches the mask 87 to the electrode of the piezoelectric element 33 that is cut from the other of the conductive metal layers 77 and 79.

The die cutting tape 81 is utilizes as the mask 81 to simplify the operation of the method.

The piezoelectric element 33 manufactured by the method of the first embodiment includes the element body 47 deforming according to a voltage applied thereto. The peripheral end faces 67, 69, 71 and 73 defining the peripheral shape of the element body 47, and the polymer coatings 49 and 51 formed on at least the peripheral end faces 71 and 73 along the direction orthogonal to the deformation direction of the element body 47, i.e., the piezoelectric element 33 by the vapor deposition polymerization.

The coatings 49 and 51 are uniformly thin so that they improve rigidity of thereof and do not affect the deformation of the piezoelectric element 33.

The piezoelectric actuator 7 with the piezoelectric element 33 includes the actuator base 31 arranged between the base plate 5 as the base and the load beam 3 as the driven part, the opening 35 formed on the actuator base 31 to accommodate or receive the piezoelectric element 33, and the adhesive 45 adhering each peripheral end face 67 (69) along the deformation direction of the piezoelectric element 33 to each inner face 41 (43) of the opening 35 facing the peripheral end face 67 (69).

The piezoelectric actuator 7 covers the end faces 67 and 69 with the adhesive 45 and covers the end faces 71 and 73 with the coatings 49 and 51, to prevent all the peripheral end faces 67, 69, 71 and 73 from producing particles.

The head suspension 1 with the piezoelectric actuator 7 prevents the magnetic disk drive from damaging due to no particles produced from the peripheral end faces 67, 69, 71 and 73 of the piezoelectric element 33. This improves the long-time reliability of the magnetic disk drive.

Figure 13:
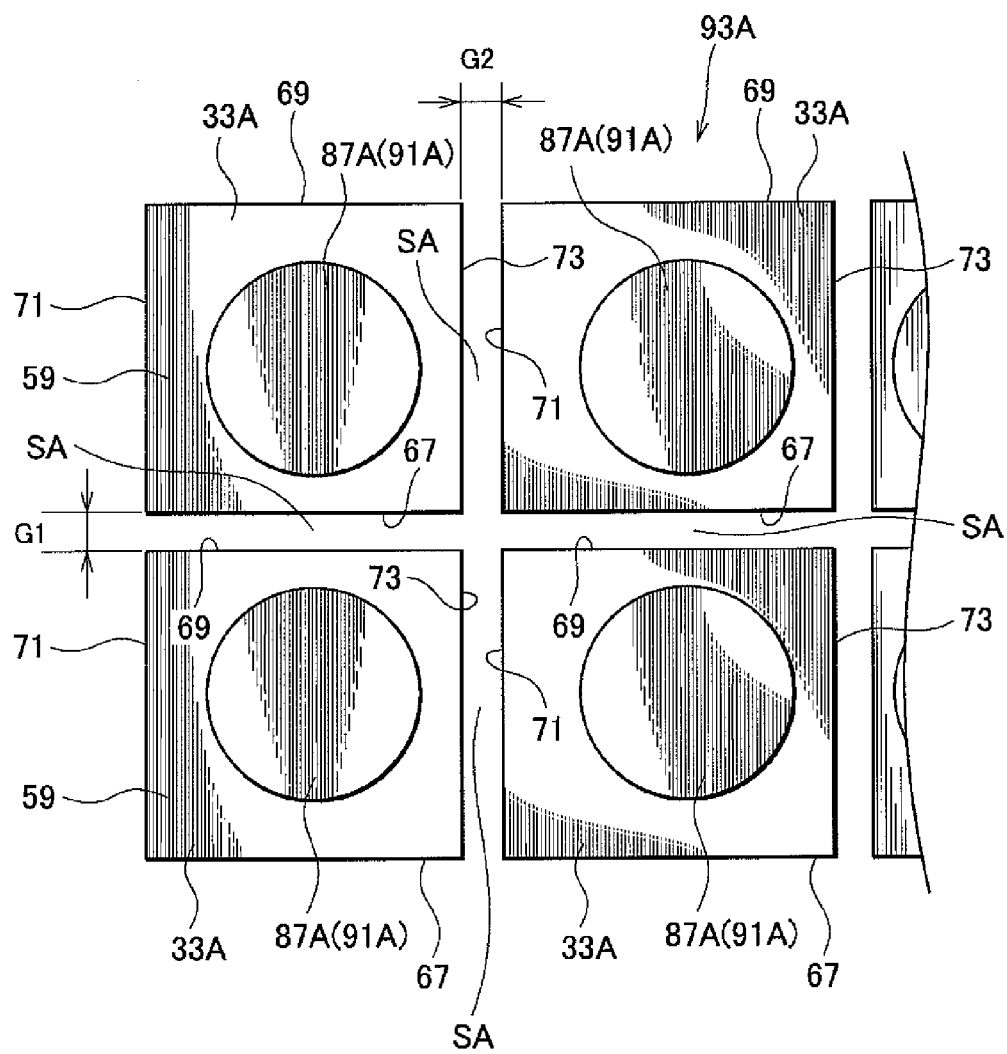
FIG. 13 is a plan view partly illustrating a plurality of piezoelectric elements and masks according to a second embodiment of the present invention.

A second embodiment of the present invention will be explained with reference to FIG. 13. FIG. 13 is a plan view illustrating a relationship between a plurality of piezoelectric elements 33A and masks 87A according to the second embodiment of the present invention. The second embodiment is basically the same as the first embodiment, and therefore, corresponding parts are represented with the same reference marks, or the same reference marks plus "A" to omit a repetition of explanation.

The second embodiment differs from the first embodiment in that the second embodiment employs masks 87A that are cylinders instead of the masks 87 that are bands of the first embodiment.

Namely, a mask jig 91A includes the plurality of masks 87A each corresponding a connecting area 63 of a second electrode 59 of each piezoelectric element 33A. Between the adjacent masks 87A, a space SA is defined in both a deformation direction and a direction orthogonal to the deformation direction of the piezoelectric element 33A.

According to the second embodiment, the spaces SA in the both directions communicate with both gaps G1 and G2 in a thickness direction of the held set 85A or piezoelectric element 33A, respectively. The gaps G1 and G2 forms a closed section together with the spaces SA and are enlarged by the spaces SA.

The method of the second embodiment is basically the same as the first embodiment. The method of the second embodiment differs from that of the first embodiment in that the masks 87A are used instead of the masks 87 only.

The second embodiment therefore provides the same effects as the first embodiment.

Additionally, the method of the second embodiment, each of the gaps G1 and G2 communicates with the space SA in the thickness direction of the held set 85A or the piezoelectric element 33A to form the closed section together with the space SA and be enlarged by the space SA.

The coatings 59, 51, 121A and 123 A are formed on the peripheral end faces 67, 69, 71 and 73, respectively, so that it prevents the piezoelectric element 33A from producing particles from all the end faces 67, 69, 71 and 73 even when the piezoelectric element 33 is individually handled before attaching to the head suspension 1.

Figure 14:
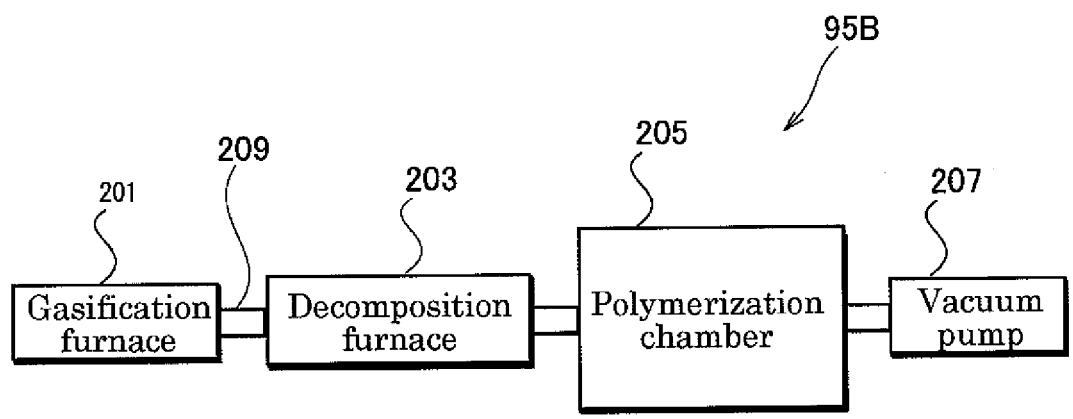
FIG. 14 is a block diagram illustrating a vapor deposition polymerization unit according to a third embodiment of the present invention.

A third embodiment of the present invention will be explained with reference to FIG. 14. FIG. 14 is a block diagram illustrating a vapor deposition polymerization unit 95B according to the third embodiment.

The third embodiment is basically the same as the first embodiment, and therefore, corresponding parts are represented with the same reference marks, or the same reference marks plus "B" to omit a repetition of explanation.

The third embodiment employs the vapor deposition polymerization unit 95B according to chemical vapor deposition (CVD) instead of the vapor deposition polymerization unit 95 of the first embodiment. The third embodiment is the same as the first embodiment except for the use of the vapor deposition polymerization unit 95B. Therefore, only the vapor deposition polymerization unit 95B will be explained.

According to the third embodiment, the unit 95B carries out vapor deposition polymerization based on thermal chemical vapor deposition. Alternatively, the vapor deposition polymerization may be based on plasma chemical vapor deposition, photo chemical vapor deposition, laser chemical vapor deposition, or the like.

The unit 95B includes a gasification furnace 201, a decomposition furnace 203, a polymerization chamber 205 and a vacuum pump 207 that are connected through a pipe line 209.

The gasification furnace 201 receives solid or powder raw materials inside and heats and gasifies them. The gasification of the raw materials is carried out under reduced pressure. The raw materials include elements that are constituents of the polymer to form coatings 49 and 51 such as parylene and that are converted into gaseous material by the gasification. The gaseous material is vacuumed by the vacuum pump 207 to pass through the decomposition furnace 203.

The decomposition furnace 203 decomposes the gaseous material with heat to form gasified monomer. For example, the decomposition furnace 203 has filaments that produce heat and pyrolyzes the gaseous material passing therethrough with the heated filaments. The gasified monomer is vacuumed by the vacuum pump 207 to be fed to the polymerization chamber 205.

The polymerization chamber 205 receives a masked set 93 to which the vapor deposition polymerization is carried out. The inside of the chamber 205 is maintained at room temperature. In the chamber 205, the gasified monomer is brought into contact with a lateral end faces 71 and 73 of each piezoelectric element 33 in the masked set 93, loses heat to the end faces 71 and 73 and polymerizes on the end faces 71 and 73.

As a result, the vapor deposition polymerization is carried out at the temperature in which the piezoelectric element 33 keeps a polarity, i.e., set in the range of ½ to ⅓ of Curie point to form the coatings 49 and 51 on the lateral end faces 71 and 73 of each piezoelectric element 33.

As mentioned above, the third embodiment carries out the vapor deposition polymerization according to the chemical vapor deposition to form the coatings 49 and 51. The polymerization decomposes gaseous material by heat to form gasified monomer and brings the gasified monomer into contact with the end faces 71 and 73 of each piezoelectric element 33 so that the gasified monomer loses heat to the end faces 71 and 73 and polymerizes on the end faces 71 and 73. Even the third embodiment employing the vapor deposition polymerization according to the chemical vapor deposition provides the same effects as the first embodiment.

The methods of the above-mentioned embodiments carry out the vapor deposition polymerization at the temperature set in the range of ½ to ⅓ of Curie point. However, the temperature only has to be a temperature in which the piezoelectric element 33 keeps a polarity thereof, and it may set over ½ of Curie point or under ⅓ of Curie point as long as the piezoelectric element 33 keeps its polymerization.

The polymer coatings 49 and 51 are made of polyurea or parylene according to the embodiments. However, it may employ other polymers capable of making coatings by vapor deposition polymerization at a temperature in which the piezoelectric element 33 keeps the polarity thereof.

According to the embodiments, the electrodes 53 and 59 are formed as the conductive metal layer 77 and 79 before the die cutting (the cutting step). Instead, the electrodes 53 and 59 may be formed on each piezoelectric element 33 after the die cutting.

According to the embodiments, the plurality of the piezoelectric elements 33 are arranged in a grid in the cut state. Instead, the cut state may be other shape according to purpose of use of the piezoelectric element.

According to the embodiments, the vapor deposition polymerization is based on the physical vapor deposition such as vacuum vapor deposition or the chemical vapor deposition such as thermal chemical vapor deposition, plasma chemical vapor deposition, photo chemical vapor deposition, laser chemical vapor deposition. However, it may employ vapor deposition polymerization based on other physical or chemical vapor deposition.

What is claimed is:

1. A method of manufacturing a piezoelectric element that deforms so as to elongate and contract along a deformation direction according to a voltage applied thereto, the method comprising steps of:
   cutting a plurality of piezoelectric elements out from a base piezoelectric material plate so that each one piezoelectric element of said plurality of piezoelectric elements has peripheral end faces that are formed to define a peripheral shape of said each one piezoelectric element and a gap is formed between facing end faces of the peripheral end faces of adjacent piezoelectric elements in said plurality of piezoelectric elements; and
   forming polymer coatings on at least opposite end faces in the peripheral end faces of the piezoelectric element in an orthogonal direction relative to the deformation direction by vapor deposition polymerization through which gasified monomer enters into the gap, respectively,
   wherein the method further comprises
   forming electrodes on opposite sides of the piezoelectric element, respectively, each said electrode to be connected to another member in order to apply a voltage to the piezoelectric element; and
   covering at least a middle portion of each said electrode in said orthogonal direction with a mask, to avoid the middle portion from the vapor deposition polymerization at a subsequent coating forming step, in which
      the mask for one of the electrodes exposes side portions of said one of the electrodes in said orthogonal direction to cover the middle portion defined between the side portions, and
      a space is defined between adjacent masks for said one of the electrodes covering the respective middle portions of the adjacent piezoelectric elements to communicate with the corresponding gap when the covering step is carried out.

2. The method of claim 1 wherein the coating forming step is carried out at a temperature in which the piezoelectric element keeps a polarity thereof.

3. The method of claim 1 wherein the coating forming step is carried out at a temperature set in a range of ½ to ⅓ of Curie point of the piezoelectric element.

4. The method of claim 1 wherein the polymer coatings are made of polyurea or parylene.

5. The method of claim 1, wherein the cutting step cuts the base piezoelectric material plate so that a plurality of piezoelectric elements are arranged at least in line along a deformation direction of the piezoelectric element, thereby forming an in-line element set, and the covering step places the mask on the in-line element set so that the mask extends over the piezoelectric elements in the in-line element set along the deformation direction.

6. The method of claim 5 wherein a plurality of in-line element sets are arranged side by side, a gap is defined between adjacent in-line element sets, and the vapor deposition polymerization is carried out through the gap.

7. The method of claim 6 wherein a plurality of masks are arranged side by side on a mask body and correspond to the plurality of the in-line element sets, respectively, and a space is defined between adjacent masks to communicate with the corresponding gap when the covering step is carried out.

8. The method of claim 7 wherein the space forms a closed section together with the corresponding gap when the covering step is carried out.

9. The method of claim 1, wherein the electrode forming step forms conductive metal layers on opposite sides of the base piezoelectric material plate, the conductive metal layers being cut together with the piezoelectric element as the electrodes in the cutting step, the cutting step attaches a holding sheet to one of the opposite sides of the base piezoelectric material plate to cover the corresponding one of the conductive metal layers and cuts the base piezoelectric material plate on the holding sheet, and the covering step attaches the mask to the electrode of the piezoelectric element that is cut from the other of the conductive metal layers.

10. The method of claim 1 wherein the vapor deposition polymerization gasifies monomer by heat and polymerizes the gasified monomer on the objective areas of the peripheral end faces of the piezoelectric element.

11. The method of claim 1 wherein the vapor deposition polymerization decomposes gaseous material by heat to form gasified monomer and brings the gasified monomer into contact with the objective areas of the peripheral end faces of the piezoelectric element so that the gasified monomer loses heat to the objective areas and polymerizes on the objective areas.

12. A method of manufacturing a first piezoelectric element having an element body, electrodes, and polymer coatings, the element body configured to deform, so as to elongate and contract along a deformation direction, in response to a voltage applied thereto, the electrodes formed on opposite sides of the element body, the element body having peripheral end faces defining a peripheral shape of the element body; and the polymer coatings continuously extending from at least opposite end faces of the peripheral end faces of the element body in an orthogonal direction relative to the deformation direction to side portions of one of the electrodes in said orthogonal direction by vapor deposition polymerization so that said one of the electrodes has an exposed portion exposing outside at a middle portion defined in said orthogonal direction between the side portions that are covered with the polymer coatings, the method comprising:

cutting a plurality of piezoelectric elements, including said first piezoelectric element, out from a base piezoelectric material plate so that each one piezoelectric element of said plurality of piezoelectric elements has peripheral end faces that are formed to define a peripheral shape of said each one piezoelectric element and a gap is formed between facing end faces in the peripheral end faces of adjacent piezoelectric elements in said plurality of piezoelectric elements;

forming polymer coatings on at least opposite end faces in the peripheral end faces of said first piezoelectric element in an orthogonal direction relative to the deformation direction by vapor deposition polymerization through which gasified monomer enters into the gap, respectively;

forming electrodes on opposite sides of the first piezoelectric element, respectively, each said electrode to be connected to another member in order to apply a voltage to the first piezoelectric element; and covering at least a middle portion of each said electrode in said orthogonal direction with a mask, to avoid the middle portion from the vapor deposition polymerization at a subsequent coating forming step.

* * * * *